(12) United States Patent
Han et al.

(10) Patent No.: US 9,118,398 B1
(45) Date of Patent: Aug. 25, 2015

(54) SWITCH CONFIGURED TO CONTROL A TRANSCEIVER AND A RADIO FREQUENCY SYSTEM COMPRISING THE SWITCH

(71) Applicant: Beken Corporation, Shanghai (CN)

(72) Inventors: Peng Han, Shanghai (CN); Dawei Guo, Shanghai (CN); Yunfeng Chen, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 0 days.

(21) Appl. No.: 14/271,446

(22) Filed: May 6, 2014

(30) Foreign Application Priority Data

Mar. 21, 2014 (CN) .......................... 2014 1 0108599

(51) Int. Cl.
*H04B 1/48* (2006.01)
*H03K 17/687* (2006.01)
*H03K 3/012* (2006.01)

(52) U.S. Cl.
CPC .................. *H04B 1/48* (2013.01); *H03K 3/012* (2013.01); *H03K 17/687* (2013.01)

(58) Field of Classification Search
CPC ............ H04B 1/48; H04B 1/44; H04B 1/403; H03K 17/687

USPC ..................................................... 455/73, 78
See application file for complete search history.

(56) References Cited

U.S. PATENT DOCUMENTS

| 8,977,217 B1 * | 3/2015 | Connick et al. ................. 455/78 |
| 2003/0162515 A1 * | 8/2003 | Zhou .......................... 455/189.1 |
| 2003/0216128 A1 * | 11/2003 | Zhou .......................... 455/127.1 |
| 2011/0148506 A1 * | 6/2011 | Korec et al. .................... 327/434 |
| 2013/0217347 A1 * | 8/2013 | Seshita ........................ 455/90.2 |
| 2014/0162575 A1 * | 6/2014 | Laskar ......................... 455/90.2 |
| 2014/0266471 A1 * | 9/2014 | Zhu et al. ........................ 331/16 |

OTHER PUBLICATIONS

P.E. Allen, "Lecture 030—Deep Submicron (DSM) CMOS Technology," CMOS Analog Circuit Design, Mar. 24, 2010.

* cited by examiner

*Primary Examiner* — Lewis West
(74) *Attorney, Agent, or Firm* — Perkins Coie LLP

(57) ABSTRACT

A circuit comprises a transmitter port; a receiver port; an antenna port configured to transmit a signal from the transmitter port to antenna port and receive a signal at antenna port and pass to the receiver port; and a switch configured to switch whether the transmitter port or the receiver port is communicatively coupled to the antenna port. The switch comprises a plurality of NMOS FETs configured to switch between the transmitter port and the receiver port.

14 Claims, 7 Drawing Sheets

SWITCH CONFIGURED TO CONTROL A TRANSCEIVER AND A RADIO FREQUENCY SYSTEM COMPRISING THE SWITCH

CLAIM OF PRIORITY

This application claims priority to Chinese Application No. 201410108599.0 entitled "A switch configured to control a transceiver, a radio frequency system and a method for operating the same," filed on Mar. 21, 2014 by Beken Corporation, which is incorporated herein by reference.

TECHNICAL FIELD

The present application relates to circuits, and more particularly but not exclusive to a switch configured to switch an RF port (ANT) between a transmitter (TX) and a receiver (RX).

BACKGROUND

Conventionally, diodes are used to switch an RF port (ANT) between the transmitter (TX) port and the receiver (RX) port. However, a diode needs direct current (DC) for operation, which introduces DC power dissipation. Further, inductors are used along with the diodes to provide a DC operating point for the diodes. The large size of inductors limits the application of the diodes in the switch for the transceiver. Therefore, it is desirable that a device can be designed to reduce DC power consumption as well as with reduced size.

SUMMARY

According to an embodiment of the invention, a switch and a circuit including the switch use Metal-Oxide-Semiconductor Field Effect Transistors (MOSFETs) and are configured to work with a transceiver.

In an embodiment, the switch comprises a first device, a first NMOS FET, a second device, a second NMOS FET, a receiver enabling node, a transmitter enabling node, a first resistor, a second resistor, a third resistor, a fourth resistor, a fifth resistor, a sixth resistor, a seventh resistor, an eighth resistor, a ninth resistor, a tenth resistor, a voltage source, a first capacitor and a second capacitor. A first terminal of the first device is connected to a transmitter port, a second terminal of the first device is connected to a receiver enabling node via the first resistor, a third terminal of the first device is connected to ground via the first capacitor, a fourth terminal of the first device is connected to ground via the second resistor, the third terminal of the first device is further connected to the voltage source via the ninth resistor. A drain of the first NMOS FET is connected to an antenna port, a gate of the first NMOS FET is connected to a transmitter enabling node via the third resistor, a source of the first NMOS FET is connected to a transmitter port, a body of the first NMOS FET is connected to ground via the fourth resistor. A first terminal of the second device is connected to the antenna port, a second terminal of the second device is connected to the receiver enabling node via the fifth resistor, a third terminal of the second device is connected to a receiver port, a fourth terminal of the second device is connected to ground via the sixth resistor. A drain of the second NMOS FET is connected to the receiver port, a gate of the second NMOS FET is connected to the transmitter enabling node via the seventh resistor, a source of the second NMOS FET is connected to ground via the second capacitor, a body of the second NMOS FET is connected to ground via the eighth resistor, the source of the second NMOS FET is further connected to the voltage source via the tenth resistor.

In another embodiment, a radio frequency system comprises a transmitter; a receiver; an antenna configured to transmit a signal from the transmitter and receive a signal and pass to the receiver; a switch configured to switch whether the transmitter or the receiver is communicatively coupled to the antenna. The switch comprises a plurality of NMOS FETs configured to switching between the transmitter and the receiver, wherein the switch further comprises a first device, a first NMOS FET, a second device, a second NMOS FET, a receiver enabling node, a transmitter enabling node, a first resistor, a second resistor, a third resistor, a fourth resistor, a fifth resistor, a sixth resistor, a seventh resistor, an eighth resistor, a ninth resistor, a tenth resistor, a voltage source, a first capacitor and a second capacitor. A first terminal of the first device is connected to the transmitter port which is communicatively connected to the transmitter, a second terminal of the first device is connected to the receiver enabling node via the first resistor, a third terminal of the first device is connected to ground via the first capacitor, a fourth terminal of the first device is connected to ground via the second resistor, the third terminal of the first device is further connected to the voltage source via the ninth resistor. A drain of the first NMOS FET is connected to an antenna port which is communicatively connected to the antenna, a gate of the first NMOS FET is connected to the transmitter enabling node via the third resistor, a source of the first NMOS FET is connected to the transmitter port, a body of the first NMOS FET is connected to ground via the fourth resistor. A first terminal of the second device is connected to the antenna port, a second terminal of the second device is connected to the receiver enabling node via the fifth resistor, a third terminal of the second device is connected to the receiver port, a fourth terminal of the second device is connected to ground via the sixth resistor. A drain of the second NMOS FET is connected to the receiver port, a gate of the second NMOS FET is connected to the transmitter enabling node via the seventh resistor, a source of the second NMOS FET is connected to ground via the second capacitor, a body of the second NMOS FET is connected to ground via the eighth resistor, the source of the second NMOS FET is further connected to the voltage source via the tenth resistor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
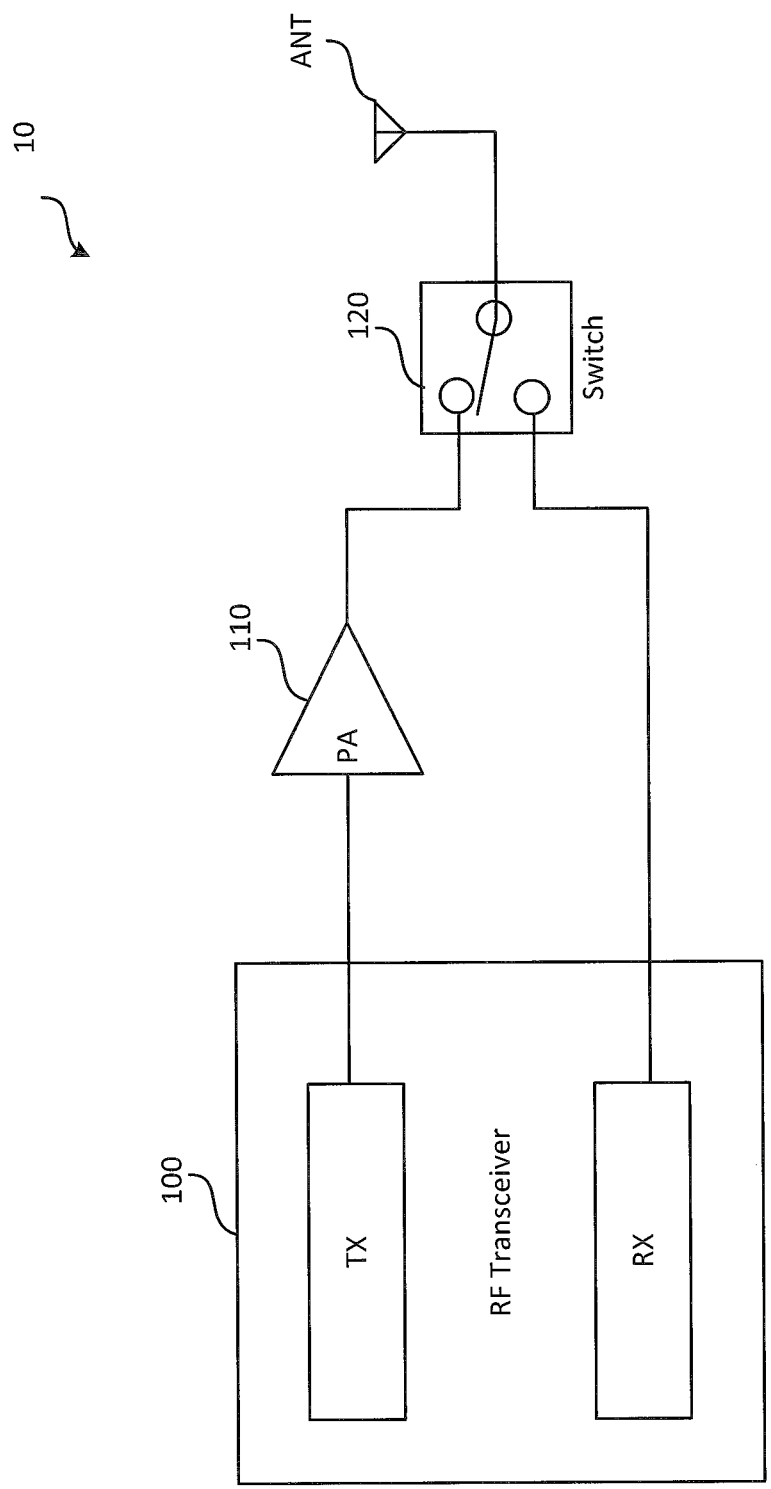
FIG. 1 is a diagram illustrating a block diagram of a radio frequency system 10 according to an embodiment of the invention.

FIG. 1 is a diagram illustrating a block diagram of a radio frequency system according to an embodiment of the invention.

The radio frequency system 10 comprises a transmitter (TX), a receiver (RX), a switch 120 and an antenna (ANT). The transmitter TX and the receiver RX can be included in a RF transceiver 100. The transmitter TX and the receiver RX may be combined in the transceiver 100 and share common circuitry and/or a single housing. The antenna ANT transmits a signal from the transmitter TX, or receives a signal and passes the signal to the receiver RX. The switch 120 switches between a first mode (also called a transmitting mode) where the transmitter TX is communicatively coupled to the antenna ANT and the receiver RX is disconnected from the antenna ANT and a second mode (also called a receiving mode) where the receiver RX is communicatively coupled to the antenna ANT and the transmitter TX is disconnected from the antenna ANT. The switch 120 shown in FIG. 1 is a single pole, double throw switch, and can changeover between connecting the transmitter TX and the receiver RX. Embodiments of the switch 120 can be implemented as switch 20A, 20B, or 30, as will be discussed further below.

Alternatively, the system 10 may further comprises a power amplifier (PA) 110 that communicatively couples the transmitter TX with the switch 120 and amplifies signals outputted by the transmitter TX.

Figure 2A:
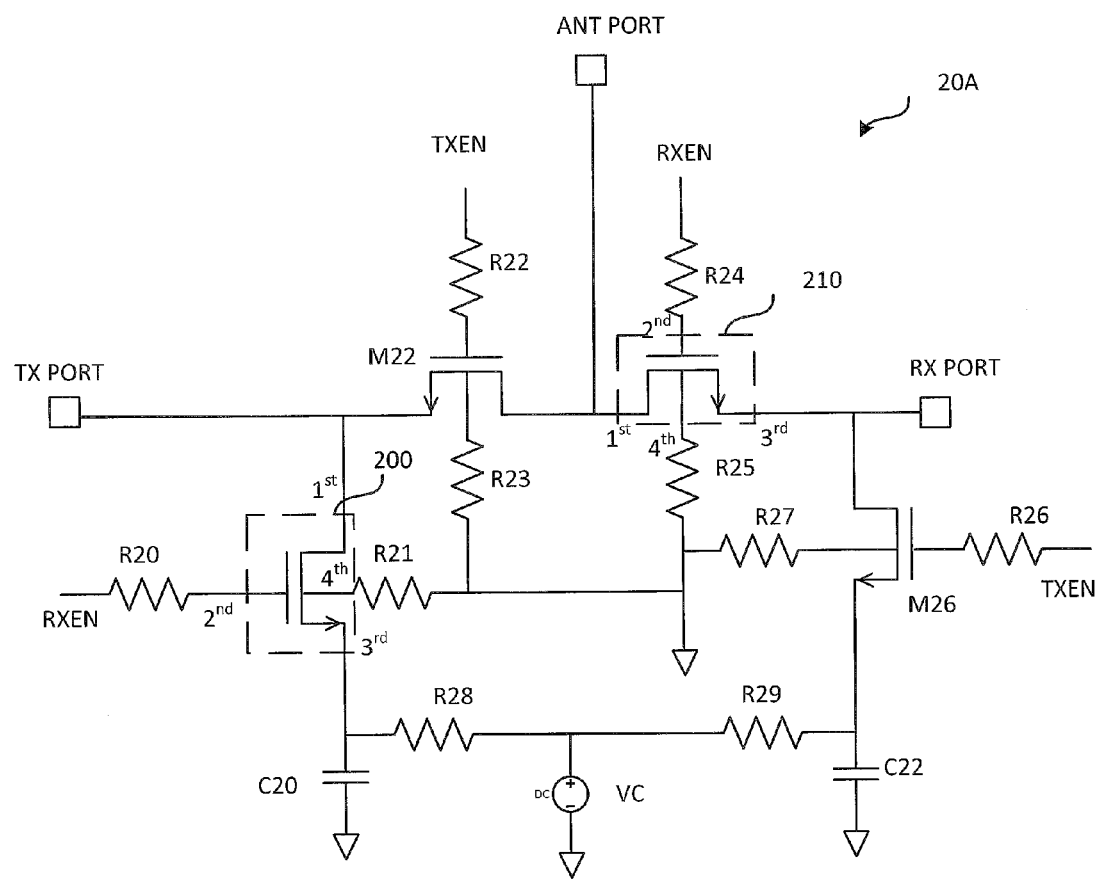
FIG. 2A is a circuit diagram illustrating a switch according to an embodiment of the invention.

FIG. 2A is a circuit diagram illustrating a switch 20A according to an embodiment of the invention. As shown in FIG. 2A, the switch 20A comprises a first device 200, a first NMOS FET M22, a second device 210, a second NMOS FET M26, a receiver enabling node RXEN, a transmitter enabling node TXEN, a first resistor R20, a second resistor R21, a third resistor R22, a fourth resistor R23, a fifth resistor R24, a sixth resistor R25, a seventh resistor R26, an eighth resistor R27, a ninth resistor R28, a tenth resistor R29, a voltage source VC, a first capacitor C20 and a second capacitor C22. The switch 20A may further comprise a transmitter TX PORT, a receiver port RX PORT, and an antenna port ANT PORT. Note that the antenna port can also be referred as RF port, as radio frequency signal is transmitted from the antenna port.

A first terminal of the first device 200 is connected to a transmitter TX PORT which is communicatively connected to the transmitter TX also shown in FIG. 1. A second terminal of the first device 200 is connected to the receiver enabling node RXEN via the first resistor R20. A third terminal of the first device 200 is connected to ground via the first capacitor C20. A fourth terminal of the first device 200 is connected to ground via the second resistor R21. The third terminal of the first device 200 is further connected to the voltage source VC via the ninth resistor R28.

A drain of the first NMOS FET M22 is connected to an antenna port ANT PORT which is communicatively connected to the antenna ANT also shown in FIG. 1. A gate of the first NMOS FET M22 is connected to the transmitter enabling node TXEN via the third resistor R22. A source of the first NMOS FET M22 is connected to the transmitter port TX PORT. A body of the first NMOS FET M22 is connected to ground via the fourth resistor R23.

A first terminal of the second device 210 is connected to the antenna port ANT PORT. A second terminal of the second device 210 is connected to the receiver enabling node RXEN via the fifth resistor R24. A third terminal of the second device 210 is connected to a receiver port RX PORT. A fourth terminal of the second device 210 is connected to ground via the sixth resistor R25.

A drain of the second NMOS FET M26 is connected to the receiver port RX PORT which is communicatively connected to the receiver RX also shown in FIG. 1. A gate of the second NMOS FET M26 is connected to the transmitter enabling node TXEN via the seventh resistor R26. A source of the second NMOS FET M26 is connected to ground via the second capacitor C22. A body of the second NMOS FET M26 is connected to ground via the eighth resistor R27. The source of the second NMOS FET M26 is further connected to the voltage source VC via the tenth resistor R29.

Figure 4:
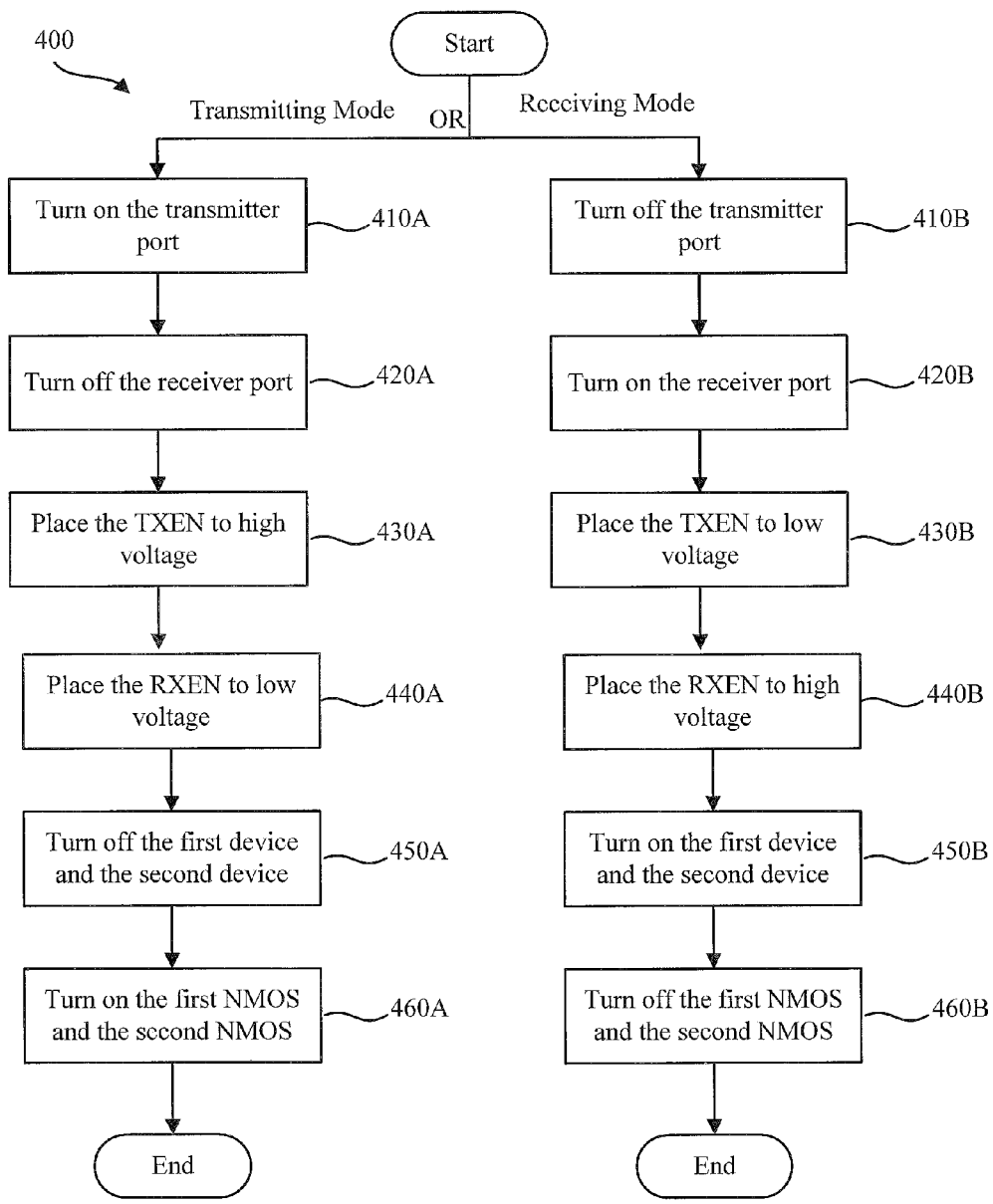
FIG. 4 is a flowchart illustrating a method of operating a switch according to an embodiment of the invention.

FIG. 4 is a flowchart illustrating a method 400 of operating the switch according to an embodiment of the invention. The method 400 comprises in a transmitting mode, turning on the transmitter TX (in block 410A); turning off the receiver RX (in block 420A); placing the TXEN to high (H) voltage (in block 430A); placing the RXEN to low (L) voltage (in block 440A); turning off the first device 200 and the second device 210 (in block 450A); and turning on the first NMOS FET M22 and the second NMOS FET M26 (in block 460A). Or, the method 400 comprises in a receiving mode, turning off the transmitter TX (in block 410B); turning on the receiver RX (in block 40B); placing the TXEN to low voltage (in block 430B); placing the RXEN to high voltage (in block 440B); turning on the first device 200 and the second device 210 (in block 450B); and turning off the first NMOS FET M22 and the second NMOS FET M26 (in block 460B).

Figure 2B:
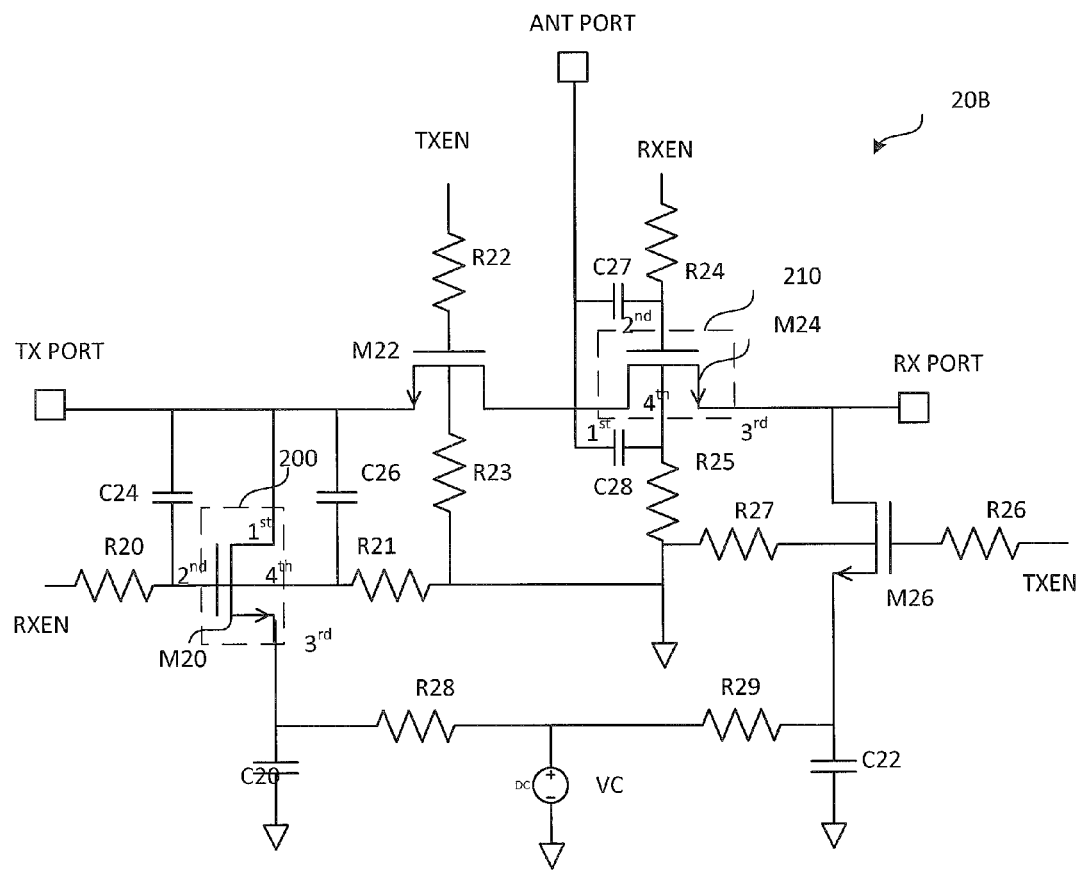
FIG. 2B is a circuit diagram illustrating a switch according to an embodiment of the invention.

FIG. 2B is a diagram illustrating a switch 20B according to an embodiment of the invention. Same or similar reference signs represent same or similar circuit elements as FIG. 2A, such as the first device 200, the second device 210, the first NMOS FET M22, the second NMOS FET M26, the first, second, third, fourth, fifth, sixth, seventh, eighth, ninth, tenth resistors R20, R21, R22, R23, R24, R25, R26, R27, R28 and R29, the first capacitor C20, the second capacitor C22, the details of which are omitted for simplicity. The switch 20B further comprises a third capacitor C24, a fourth capacitor C26, a fifth capacitor C27 and a sixth capacitor C28.

The third capacitor C24 is disposed between the first terminal and the second terminal of the first device 200. The fourth capacitor C26 is disposed between the fourth terminal and the first terminal of the first device 200. The fifth capacitor C27 is disposed between the first terminal and the second terminal of the second device 210. The sixth capacitor C28 is disposed between the fourth terminal and the first terminal of the second device 210.

Alternatively, the first device 200 comprises a third NMOS FET M20. The first terminal of the first device 200 comprises a drain of the third NMOS FET M20. The second terminal of the first device 200 comprises a gate of the third NMOS FET M20. The third terminal of the first device 200 comprises a source of the third NMOS FET M20. The fourth terminal of the first device 200 comprises a body of the third NMOS FET M20.

Alternatively, the second device 210 comprises a fourth NMOS FET M24. The first terminal of the second device 210 comprises a drain of the fourth NMOS FET M24. The second terminal of the second device 210 comprises a gate of the fourth NMOS FET M24. The third terminal of the second device 210 comprises a source of the fourth NMOS FET M24. The fourth terminal of the second device 210 comprises a body of the fourth NMOS FET M24.

FIG. 4 is a flowchart illustrating a method 400 of operating the switch according to an embodiment of the invention. The method 400 comprises in a transmitting mode, turning on the transmitter port TX PORT (in block 410A); turning off the receiver port RX PORT (in block 420A); placing the transmitter enabling node TXEN to high (H) voltage (in block 430A); placing the receiver enabling node RXEN to low (L) voltage (in block 440A); turning off the first device 200 and the second device 210 (in block 450A); and turning on the first NMOS FET M22 and the second NMOS FET M26 (in block 460A). Or, the method 400 comprises in a receiving mode, turning off the transmitter port TX PORT (in block 410B); turning on the receiver port RX PORT (in block 420B); placing the transmitter enabling node TXEN to low voltage (in block 430B); placing the receiver enabling node RXEN to high voltage (in block 440B); turning on the first device 200 and the second device 210 (in block 450B); and turning off the first NMOS FET M22 and the second NMOS FET M26 (in block 460B).

Figure 3:
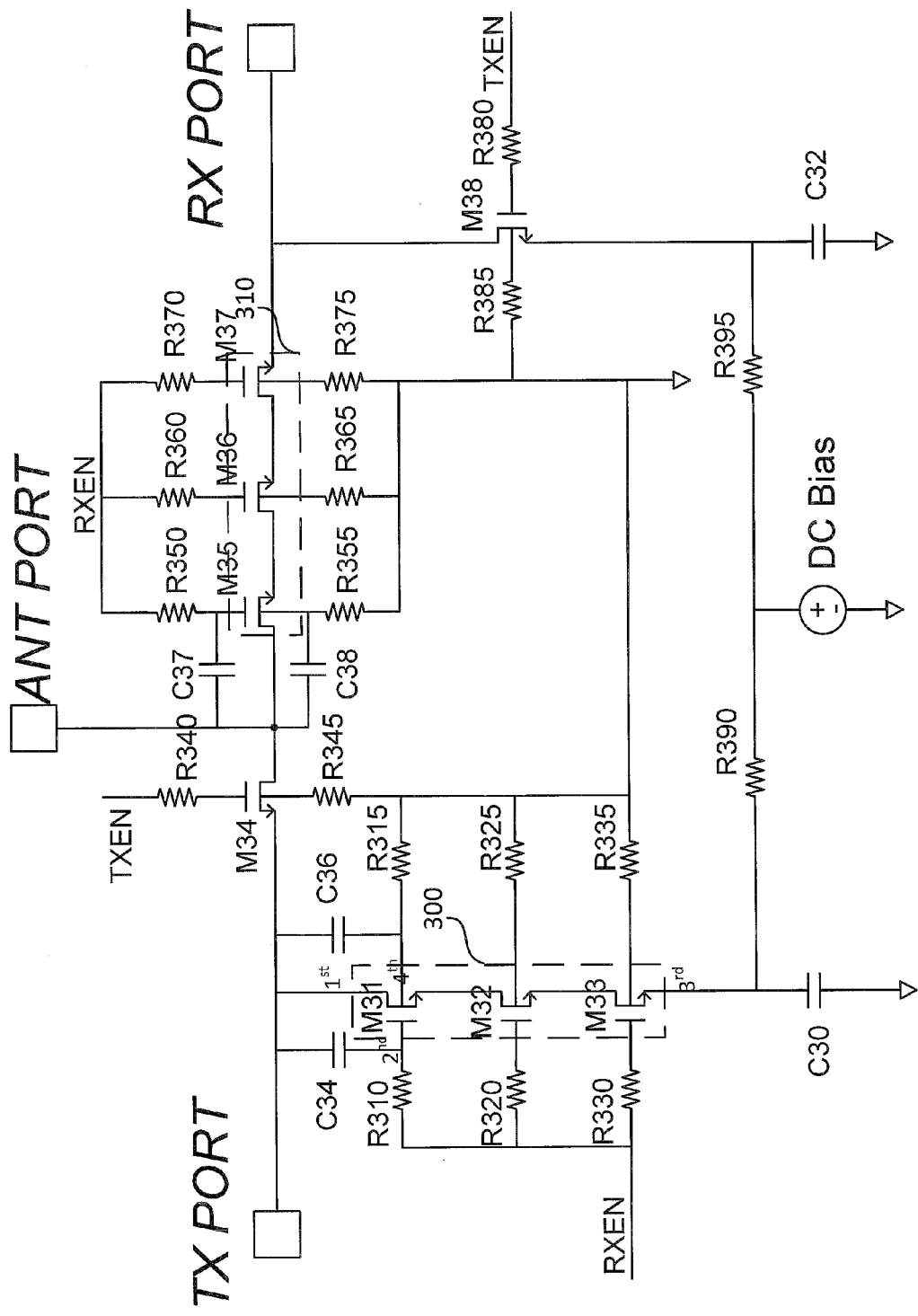
FIG. 3 is a circuit diagram illustrating a switch according to another embodiment of the invention.

Referring back to FIG. 3, FIG. 3 is a circuit diagram illustrating a switch 30 according to an embodiment of the invention. The switch 30 comprises a first device 300, a first NMOS FET M34, a second device 310, a second NMOS FET M38, a receiver enabling node RXEN, a transmitter enabling node TXEN, a first resistor R310, a second resistor R315, a third resistor R340, a fourth resistor R345, a fifth resistor R350, a sixth resistor R355, a seventh resistor R380, an eighth resistor R385, a ninth resistor R390, a tenth resistor R395, a voltage source VC, a first capacitor C30 and a second capacitor C32.

The first device 300 comprises a third NMOS FET M31, a fifth NMOS FET M32 and a sixth NMOS FET M33. The first terminal of the first device 300 comprises a drain of the third NMOS FET M31. The second terminal of the first device 300 comprises a gate of the third NMOS FET M31. The third terminal of the first device 300 comprises a source of the sixth NMOS FET M33. The fourth terminal of the first device 300 comprises a body of the third NMOS FET M31.

The drain of the third NMOS FET M31 is connected to the transmitter port TX PORT. The gate of the third NMOS FET M31 is connected to the receiver enabling node RXEN via the first resistor R310. A source of the third NMOS FET M31 is connected to a drain of the fifth NMOS FET M32. The body of the third NMOS FET is connected to ground via the second resistor R315.

The drain of the fifth NMOS FET M32 is connected to the source of the third NMOS FET M31. A gate of the fifth NMOS FET M32 is connected to the receiver enabling node RXEN via an eleventh resistor R320. A source of the fifth NMOS FET M32 is connected to a drain of the sixth NMOS FET M33. A body of the fifth NMOS FET M32 is connected to ground via a twelfth resistor R325.

The drain of the sixth NMOS FET M33 is connected to the source of the fifth NMOS FET M32. A gate of the sixth NMOS FET M33 is connected to the receiver enabling node RXEN via a thirteenth resistor R330. A body of the sixth NMOS FET M33 is connected to ground via a fourteenth resistor R335. The source of the sixth NMOS FET M33 is connected to ground via the first capacitor C30, and the source of the sixth NMOS FET M33 is also connected to the voltage source VC via the ninth resistor R390.

Alternatively, the second device 310 comprises a fourth NMOS FET M35, a seventh NMOS FET M36 and an eighth NMOS FET M37. The first terminal of the second device 310 comprises a drain of the fourth NMOS FET M35. The second terminal of the second device 310 comprises a gate of the fourth NMOS FET M35. The third terminal of the second device 310 comprises a source of the eighth NMOS FET M37. The fourth terminal of the second device 310 comprises a body of the fourth NMOS FET M35.

The drain of the fourth NMOS FET M35 is connected to the antenna port ANT PORT. The gate of the fourth NMOS FET M35 is connected to the receiver enabling node RXEN via the fifth resistor R350. A source of the fourth NMOS FET M35 is connected to a drain of the seventh NMOS FET M36. The body of the fourth NMOS FET M35 is connected to ground via the sixth resistor R355.

The drain of the seventh NMOS FET M36 is connected to the source of the fourth NMOS FET M35. A gate of the seventh NMOS FET M36 is connected to the receiver enabling node RXEN via a fifteenth resistor R360. A source of the seventh NMOS FET M36 is connected to a drain of the eighth NMOS FET M37. A body of the seventh NMOS FET M36 is connected to ground via a sixteenth resistor R365.

The drain of the eighth NMOS FET M37 is connected to the source of the seventh NMOS FET M36. A gate of the eighth NMOS FET M37 is connected to the receiver enabling node RXEN via a seventeenth resistor R370. A source of the eighth NMOS FET M37 is connected to the receiver RX, and a body of the eighth NMOS FET M37 is connected to ground via an eighteenth resistor R375.

The switch 30 further comprises a third capacitor C34, a fourth capacitor C36, a fifth capacitor C37 and a sixth capacitor C38.

The third capacitor C34 is disposed between the drain and the gate of the third NMOS FET M31. The fourth capacitor C36 is disposed between the body and the drain of the third NMOS FET M31. The fifth capacitor C37 is disposed between the drain and the gate of the seventh NMOS FET M36. The sixth capacitor C38 is disposed between the body and the drain of the seventh NMOS FET M36.

The first capacitor C30 provides an alternate current path for the NMOS FETs M31, M32 and M33. The first resistor R310, the eleventh resistor R320, the thirteenth resistor R330 reduce power leakage, since when the switch 30 is operating in high frequency, these resistors R310, R320 and R330 prevent the formation of a high frequency path. Current through these resistors R310, R320 and R330 results in voltage drops, therefore the voltages on the gates of M31, M32 and M33 are variable instead of being constant to the voltage of RXEN. The third capacitor C34 provides an alternating current path between the gate of the third NMOS FET M31 and the transmitter port TX PORT, so as to enable the voltage of the gate of the third NMOS FET M31 to quickly follow the voltage of the transmitter port TX PORT. The fourth capacitor C36 provides an alternating current path between the drain of the third NMOS FET M31 and the body of the third NMOS FET M31, so as to enable the voltage of the body of the third NMOS FET M31 to quickly follow the voltage of the drain of the third NMOS FET M31.

An operation process of the circuit 30 will be described briefly as follows. When the transceiver 100 is operating in the transmitting mode, transmitter port TX PORT is ON and receiver port RX PORT is OFF, the transmitter enabling node TXEN is placed to high (H) voltage and the RXEN is placed to low (L) voltage. The first NMOS FET M34 and second NMOS FET M38 are ON. The third NMOS FET M31, a fifth NMOS FET M32 and a sixth NMOS FET M33, and the fourth NMOS FET M35, the seventh NMOS FET M36 and the eighth NMOS FET M37 are OFF. Therefore, the transmitting signal from the transmitter port TX PORT can be provided to the antenna port ANT PORT via the first NMOS FET M34, and the leakage signal from the antenna port ANT PORT to the receiver port RX PORT can be shunt to the ground via the second NMOS FET M38. Further, as the fourth NMOS FET M35, the seventh NMOS FET M36 and the eighth NMOS FET M37 are OFF, the receiver port RX PORT will be isolated from the antenna port ANT PORT.

Alternatively, when the transceiver 100 is operating in the receiving mode, the transmitter port TX PORT is OFF and receiver port RX PORT is ON, the transmitter enabling node TXEN is placed to low (L) voltage and the receiver enabling node RXEN is placed to high (H) voltage. The first NMOS FET M34 and second NMOS FET M38 are OFF. The third NMOS FET M31, a fifth NMOS FET M32 and a sixth NMOS FET M33, and the fourth NMOS FET M35, the seventh NMOS FET M36 and the eighth NMOS FET M37 are ON. Therefore, the receiving signal from antenna port ANT PORT can be provided to the receiver port RX PORT via the fourth NMOS FET M35, the seventh NMOS FET M36 and the eighth NMOS FET M37, and any signal or noise from the transmitter port TX PORT can be shunt to the ground via the third NMOS FET M31, the fifth NMOS FET M32 and the sixth NMOS FET M33. Further, as the first NMOS FET M34 is OFF, the transmitting signal from the transmitter port TX PORT will be isolated from the antenna port ANT PORT. As the second NMOS FET M38 is OFF, the receiving signal to the receiver port RX PORT will not be shunt to ground.

FIG. 4 is a flowchart illustrating a method 400 of operating the switch according to an embodiment of the invention. The method 400 comprises in a transmitting mode, turning on the transmitter port TX PORT (in block 410A); turning off the receiver port RX PORT (in block 420A); placing the transmitter enabling node TXEN to high (H) voltage (in block 430A); placing the RXEN to low (L) voltage (in block 440A); turning off the first device 300 and the second device 310 (in block 450A); and turning on the first NMOS FET M34 and the second NMOS FET M38 (in block 460A). Or, the method 400 comprises in a receiving mode, turning off the transmitter port TX PORT (in block 410B); turning on the receiver port RX PORT (in block 420B); placing the transmitter enabling node TXEN to low voltage (in block 430B); placing the receiver enabling node RXEN to high voltage (in block 440B); turning on the first device 300 and the second device 310 (in block 450B); and turning off the first NMOS FET M34 and the second NMOS FET M38 (in block 460B).

Figure 5:
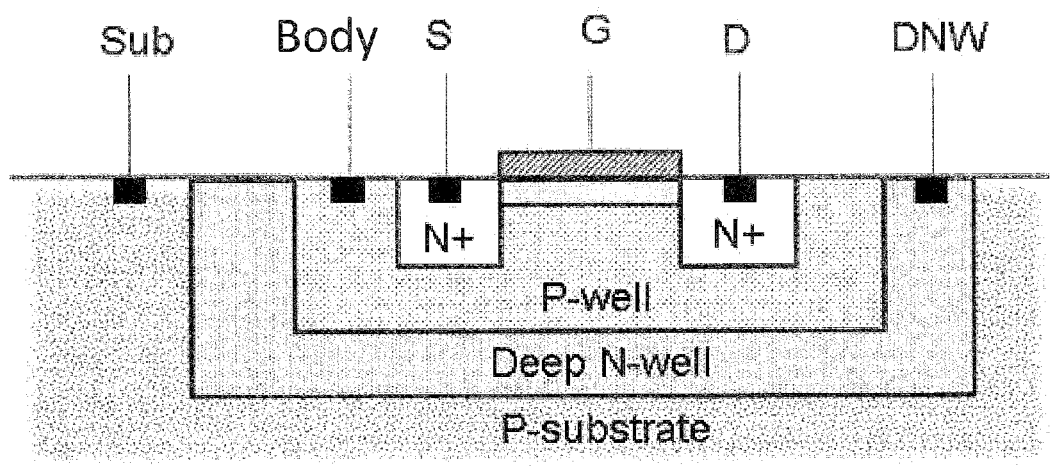
FIG. 5 is a cross section view illustrating a structure of a NMOS FET in a Deep-Nwell according to an embodiment of the invention.

FIG. 5 is a cross section view illustrating a structure of the NMOS FET in deep n-well (DNW) discussed above, such as NMOS FETs M20, M22, M24, M26, M31, M32, M33, M34, M35, M36, M37 and M38, according to an embodiment of the invention. In additional to the four terminals discussed above, such as the first terminal-drain (D), the second terminal-gate (G), the third terminal-source (S), and the fourth terminal-body, each of the plurality of NMOS FETs comprises a deep N-well located between a P-well which holds two N plus regions and a P-substrate.

Figure 6:
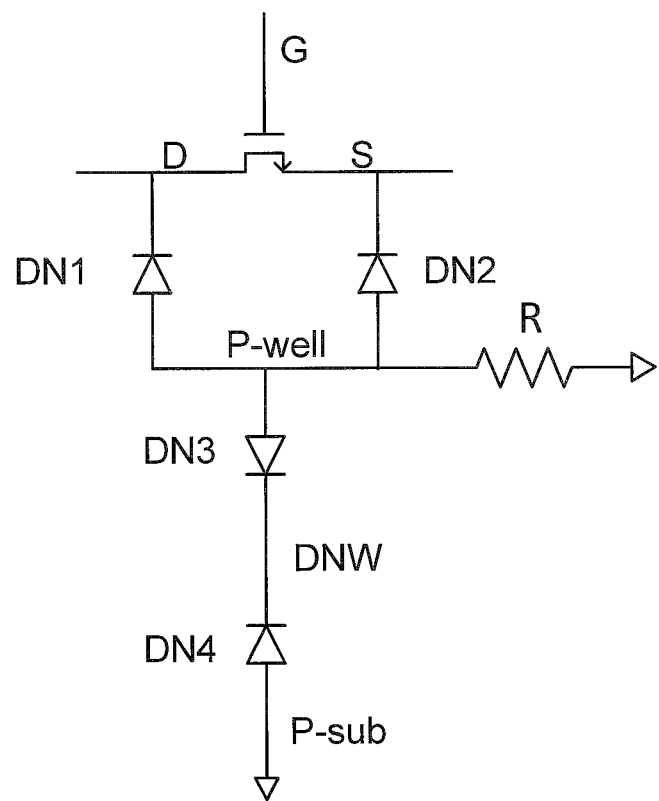
FIG. 6 is an equivalent circuit diagram of the structure shown in FIG. 5.

FIG. 6 is an equivalent circuit diagram of the structure shown in FIG. 5. As shown in FIG. 6, a first parasitic diode DN1 is located between the drain and the P-well. An anode of the first parasitic diode DN1 is connected to the P-well, and a cathode of the first parasitic diode DN1 is connected to the drain. A second parasitic diode DN2 is located between the source to the P-well. An anode of the second parasitic diode DN2 is connected to the P-well, and a cathode of the second parasitic diode DN2 is connected to the source. A third parasitic diode DN3 and a fourth parasitic diode DN4 are located between the P-well and the P-substrate in a back-to-back manner. To be specific, both a cathode of the third parasitic diode DN3 and a cathode of the fourth parasitic diode DN4 are connected to the deep N-well. An anode of the third parasitic diode DN3 is connected to the P-well. An anode of the fourth parasitic diode DN4 is connected to the P-substrate. The third parasitic diode DN3 between the P-well and DNW and the fourth parasitic diode DN4 between the DNW and the P-sub form a good isolation between the P-well and the P-sub. Further, the P-well is connected to ground via a resistor, and the DNW is floating. In this circuit configuration, no matter how large the amplitude of input signal, a signal path between ground and the source or between ground and drain cannot be formed.

When NMOS FETs in DNW are used in the switched circuit, no inductance is introduced, thus reducing the size of integrated circuit. Further, NMOS FET does not require direct current (DC) during operation, thus reducing DC power dissipation. Further the NMOS FET can be integrated in a circuit instead of designing in a standalone circuit. Further, the circuit has good linearity before reaching the gain compression point of the NMOS FET.

It should be appreciated by those skilled in the art that components from different embodiments may be combined to yield another technical solution. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A switch comprising:
a first device, a first NMOS FET, a second device, a second NMOS FET, a receiver enabling node, a transmitter enabling node, a first resistor, a second resistor, a third resistor, a fourth resistor, a fifth resistor, a sixth resistor, a seventh resistor, an eighth resistor, a ninth resistor, a tenth resistor, a voltage source, a first capacitor and a second capacitor; wherein
a first terminal of the first device is connected to a transmitter port, a second terminal of the first device is connected to a receiver enabling node via the first resistor, a third terminal of the first device is connected to ground via the first capacitor, a fourth terminal of the first device is connected to ground via the second resistor, the third terminal of the first device is further connected to the voltage source via the ninth resistor;
a drain of the first NMOS FET is connected to an antenna port, a gate of the first NMOS FET is connected to a transmitter enabling node via the third resistor, a source of the first NMOS FET is connected to the transmitter port, a body of the first NMOS FET is connected to ground via the fourth resistor;
a first terminal of the second device is connected to the antenna port, a second terminal of the second device is connected to the receiver enabling node via the fifth resistor, a third terminal of the second device is connected to a receiver port, a fourth terminal of the second device is connected to ground via the sixth resistor;
a drain of the second NMOS FET is connected to the receiver port, a gate of the second NMOS FET is connected to the transmitter enabling node via the seventh resistor, a source of the second NMOS FET is connected to ground via the second capacitor, a body of the second NMOS FET is connected to ground via the eighth resistor, the source of the second NMOS FET is further connected to the voltage source via the tenth resistor.

2. The circuit of claim 1, wherein the switch further comprises a third capacitor, a fourth capacitor, a fifth capacitor and a sixth capacitor, wherein
the third capacitor is disposed between the first terminal and the second terminal of the first device;
the fourth capacitor is disposed between the fourth terminal and the first terminal of the first device;
the fifth capacitor is disposed between the first terminal and the second terminal of the second device; and
the sixth capacitor is disposed between the fourth terminal and the first terminal of the second device.

3. The circuit of claim 1, wherein the first device comprises a third NMOS FET, and
the first terminal of the first device comprises a drain of the third NMOS FET,
the second terminal of the first device comprises a gate of the third NMOS FET,
the third terminal of the first device comprises a source of the third NMOS FET, and
the fourth terminal of the first device comprises a body of the third NMOS FET, and
wherein the second device comprises a fourth NMOS FET, and
the first terminal of the second device comprises a drain of the fourth NMOS FET,
the second terminal of the second device comprises a gate of the fourth NMOS FET,
the third terminal of the second device comprises a source of the fourth NMOS FET, and
the fourth terminal of the second device comprises a body of the fourth NMOS FET.

4. The circuit of claim 1, wherein the first device comprises a third NMOS FET, a fifth NMOS FET and a sixth NMOS FET; wherein
a drain of the third NMOS FET is connected to the transmitter port, a gate of the third NMOS FET is connected to the receiver enabling node via the first resistor, a source of the third NMOS FET is connected to a drain of the fifth NMOS FET, a body of the third NMOS FET is connected to ground via the second resistor;
the drain of the fifth NMOS FET is connected to the source of the third NMOS FET, a gate of the fifth NMOS FET is connected to the receiver enabling node via an eleventh resistor, a source of the fifth NMOS FET is connected to a drain of the sixth NMOS FET, a body of the fifth NMOS FET is connected to ground via a twelfth resistor;
the drain of the sixth NMOS FET is connected to the source of the fifth NMOS FET, a gate of the sixth NMOS FET is connected to the receiver enabling node via a thirteenth resistor, a body of the sixth NMOS FET is connected to ground via a fourteenth resistor, a source of the sixth NMOS FET is connected to ground via the first capacitor, and the source of the sixth NMOS FET is connected to the voltage source via the ninth resistor.

5. The circuit of claim 1, wherein the second device comprises a fourth NMOS FET, a seventh NMOS FET and an eighth NMOS FET wherein
a drain of the fourth NMOS FET is connected to the antenna port, a gate of the fourth NMOS FET is connected to the receiver enabling node via the fifth resistor, a source of the fourth NMOS FET is connected to a drain of the seventh NMOS FET, a body of the fourth NMOS FET is connected to ground via the sixth resistor;
the drain of the seventh NMOS FET is connected to the source of the fourth NMOS FET, a gate of the seventh NMOS FET is connected to the receiver enabling node via a fifteenth resistor, a source of the seventh NMOS FET is connected to a drain of the eighth NMOS FET, a body of the seventh NMOS FET is connected to ground via a sixteenth resistor;
the drain of the eighth NMOS FET is connected to the source of the seventh NMOS FET, a gate of the eighth NMOS FET is connected to the receiver enabling node via a seventeenth resistor, a source of the eighth NMOS FET is connected to the receiver, and a body of the eighth NMOS FET is connected to ground via an eighteenth resistor.

6. The circuit of claim 1, wherein each of the plurality of NMOS FETs comprises a deep N-well located between a P-well which holds two N plus regions and a P-substrate.

7. A radio frequency system, comprising:
a transmitter;
a receiver;
an antenna configured to transmit a signal from the transmitter and receive a signal and pass to the receiver;
a switch configured to switch whether the transmitter or the receiver is communicatively coupled to an antenna port which is communicatively connected to the antenna; wherein the switch comprises a plurality of NMOS FETs configured to switching between the transmitter and the receiver, wherein the switch further comprises
a first device, a first NMOS FET, a second device, a second NMOS FET, a receiver enabling node, a transmitter enabling node, a first resistor, a second resistor, a third resistor, a fourth resistor, a fifth resistor, a sixth resistor, a seventh resistor, an eighth resistor, a ninth resistor, a tenth resistor, a voltage source, a first capacitor and a second capacitor; wherein
a first terminal of the first device is connected to the transmitter port which is communicatively connected to the transmitter, a second terminal of the first device is connected to the receiver enabling node via the first resistor, a third terminal of the first device is connected to ground via the first capacitor, a fourth terminal of the first device is connected to ground via the second resistor, the third terminal of the first device is further connected to the voltage source via the ninth resistor;
a drain of the first NMOS FET is connected to an antenna port which is communicatively connected to the antenna, a gate of the first NMOS FET is connected to the transmitter enabling node via the third resistor, a source of the first NMOS FET is connected to the transmitter port, a body of the first NMOS FET is connected to ground via the fourth resistor;
a first terminal of the second device is connected to the antenna port, a second terminal of the second device is connected to the receiver enabling node via the fifth resistor, a third terminal of the second device is connected to the receiver port, a fourth terminal of the second device is connected to ground via the sixth resistor;
a drain of the second NMOS FET is connected to the receiver, a gate of the second NMOS FET is connected to the transmitter enabling node via the seventh resistor, a source of the second NMOS FET is connected to ground via the second capacitor, a body of the second NMOS FET is connected to ground via the eighth resistor, the source of the second NMOS FET is further connected to the voltage source via the tenth resistor.

8. The system of claim 7, wherein the switch further comprises a third capacitor a fourth capacitor, a fifth capacitor and a sixth capacitor, wherein
the third capacitor is disposed between the first terminal and the second terminal of the first device;
the fourth capacitor is disposed between the fourth terminal and the first terminal of the first device;
the fifth capacitor is disposed between the first terminal and the second terminal of the second device; and
the sixth capacitor is disposed between the fourth terminal and the first terminal of the second device.

9. The system of claim 7, wherein the first device comprises a third NMOS FET, and
the first terminal of the first device comprises a drain of the third NMOS FET,
the second terminal of the first device comprises a gate of the third NMOS FET,
the third terminal of the first device comprises a source of the third NMOS FET, and
the fourth terminal of the first device comprises a body of the third NMOS FET, and/or
wherein the second device comprises a fourth NMOS FET, and
the first terminal of the second device comprises a drain of the fourth NMOS FET,
the second terminal of the second device comprises a gate of the fourth NMOS FET,
the third terminal of the second device comprises a source of the fourth NMOS FET, and
the fourth terminal of the second device comprises a body of the fourth NMOS FET.

10. The system of claim 7, wherein the first device comprises a third NMOS FET, a fifth NMOS FET and a sixth NMOS FET; wherein
a drain of the third NMOS FET is connected to the transmitter port, a gate of the third NMOS FET is connected to the receiver enabling node via the first resistor, a source of the third NMOS FET is connected to a drain of the fifth NMOS FET, a body of the third NMOS FET is connected to ground via the second resistor;
the drain of the fifth NMOS FET is connected to the source of the third NMOS FET, a gate of the fifth NMOS FET is connected to the receiver enabling node via an eleventh resistor, a source of the fifth NMOS FET is connected to a drain of the sixth NMOS FET, a body of the fifth NMOS FET is connected to ground via a twelfth resistor;
the drain of the sixth NMOS FET is connected to the source of the fifth NMOS FET, a gate of the sixth NMOS FET is connected to the receiver enabling node via a thirteenth resistor, a body of the sixth NMOS FET is connected to ground via a fourteenth resistor, a source of the sixth NMOS FET is connected to ground via the first capacitor, and the source of the sixth NMOS FET is connected to the voltage source via the ninth resistor.

11. The system of claim 7, wherein the second device comprises a fourth NMOS FET, a seventh NMOS FET and an eighth NMOS FET; wherein
a drain of the fourth NMOS FET is connected to the antenna port, a gate of the fourth NMOS FET is connected to the receiver enabling node via the fifth resistor, a source of the fourth NMOS FET is connected to a drain of the seventh NMOS FET, a body of the fourth NMOS FET is connected to ground via the sixth resistor;
the drain of the seventh NMOS FET is connected to the source of the fourth NMOS FET, a gate of the seventh NMOS FET is connected to the receiver enabling node via a fifteenth resistor, a source of the seventh NMOS FET is connected to a drain of the eighth NMOS FET, a body of the seventh NMOS FET is connected to ground via a sixteenth resistor;
the drain of the eighth NMOS FET is connected to the source of the seventh NMOS FET, a gate of the eighth NMOS FET is connected to the receiver enabling node via a seventeenth resistor, a source of the eighth NMOS FET is connected to the receiver, and a body of the eighth NMOS FET is connected to ground via an eighteenth resistor.

12. The system of claim 7, wherein each of the plurality of NMOS FETs comprises a deep N-well located between a P-well which holds two heavily doped N region and a P-substrate.

13. The system of claim 7, further comprising a power amplifier communicatively couple the transmitter port with the switch and configured to amplify signals outputted by the transmitter port.

14. A method for operating a switch, wherein the switch comprises:
a first device, a first NMOS FET, a second device, a second NMOS FET, a receiver enabling node, a transmitter enabling node, a first resistor, a second resistor, a third resistor, a fourth resistor, a fifth resistor, a sixth resistor, a seventh resistor, an eighth resistor, a ninth resistor, a tenth resistor, a voltage source, a first capacitor and a second capacitor; wherein
a first terminal of the first device is connected to a transmitter port, a second terminal of the first device is connected to a receiver enabling node via the first resistor, a third terminal of the first device is connected to ground via the first capacitor, a fourth terminal of the first device is connected to ground via the second resistor, the third terminal of the first device is further connected to the voltage source via the ninth resistor;
a drain of the first NMOS FET is connected to an antenna port, a gate of the first NMOS FET is connected to a transmitter enabling node via the third resistor, a source of the first NMOS FET is connected to the transmitter port, a body of the first NMOS FET is connected to ground via the fourth resistor;
a first terminal of the second device is connected to the antenna port, a second terminal of the second device is connected to the receiver enabling node via the fifth resistor, a third terminal of the second device is connected to the receiver, a fourth terminal of the second device is connected to ground via the sixth resistor;
a drain of the second NMOS FET is connected to the receiver, a gate of the second NMOS is connected to the transmitter enabling node via the seventh resistor, a source of the second NMOS FET is connected to ground via the second capacitor, a body of the second NMOS FET is connected to ground via the eighth resistor, the source of the second NMOS FET is further connected to the voltage source via the tenth resistor;
wherein the method comprises:
in a transmitting mode:
turning on the transmitter port;
turning off the receiver port;
placing the transmitter enabling node to high voltage;
placing the receiver enabling node to low voltage;
turning off the first device and the second device; and turning on the first NMOS FET and the second NMOS FET;
in a receiving mode:
  turning off the transmitter port;
  turning on the receiver port;
  placing the transmitter enabling node to low voltage;
  placing the receiver enabling node to high voltage;
  turning on the first device and the second device; and
  turning off the first NMOS FET and the second NMOS FET.

* * * * *